(12) United States Patent
Cameron (10) Patent No.: US 6,940,929 B2
(45) Date of Patent: Sep. 6, 2005

(54) LOW-LATENCY HIGH-SPEED TRELLIS DECODER

(75) Inventor: Kelly B. Cameron, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/829,122

(22) Filed: Apr. 21, 2004

(65) Prior Publication Data

US 2004/0196918 A1 Oct. 7, 2004

Related U.S. Application Data

(63) Continuation of application No. 09/498,779, filed on Feb. 5, 2000, now Pat. No. 6,741,664.
(60) Provisional application No. 60/118,725, filed on Feb. 5, 1999.

(51) Int. Cl.[7] .................... H03D 1/00; H04L 27/06; G06F 11/10
(52) U.S. Cl. .............. 375/341; 375/262; 375/265; 714/795; 714/796
(58) Field of Search .................... 375/261, 262, 375/265, 340, 341, 346; 714/792, 794, 795, 796

(56) References Cited

U.S. PATENT DOCUMENTS

| | | | |
|---|---|---|---|
| 4,777,636 A | 10/1988 | Yamashita et al. | |
| 5,408,502 A | 4/1995 | How | |
| 5,914,988 A | 6/1999 | Hu et al. | |
| 5,982,822 A | * 11/1999 | Hatakeyama | 375/341 |
| 5,991,343 A | 11/1999 | Oh et al. | |
| RE36,980 E | * 12/2000 | Kim et al. | 348/608 |
| 6,256,352 B1 | * 7/2001 | Chang | 375/240.26 |
| 6,324,226 B1 | 11/2001 | Sasagawa | |
| 6,373,900 B2 | 4/2002 | Agazzi et al. | |
| 6,385,258 B1 | 5/2002 | Ooya et al. | |
| 6,477,680 B2 | 11/2002 | Mujtaba | |

* cited by examiner

Primary Examiner—Young T. Tse
(74) Attorney, Agent, or Firm—Christie, Parker & Hale, LLP (57) ABSTRACT

A method for decoding a word received at a current time instant into a symbol of a trellis code. The trellis code corresponds to a trellis diagram having N states associated with the current time instant. Each of the N states corresponds to at least one incoming branch. Each of the incoming branches is associated with a symbol of the trellis code. The branch metrics are computed for the incoming branches such that a branch metric represents a distance between the received word and a symbol associated with the corresponding branch. The branch metric is represented by fewer bits than a squared Euclidian metric representation of the distance. For each of the N states, a node metric is computed based on corresponding branch metrics and one of the incoming branches associated with the state is selected. One of the N states is selected as an optimal state based on the node metrics. The symbol associated with the selected incoming branch corresponding to the optimal state is the decoded word.

20 Claims, 11 Drawing Sheets

LOW-LATENCY HIGH-SPEED TRELLIS DECODER

CROSS-REFERENCE TO RELATED APPLICATIONS

This application is a continuation of U.S. patent application Ser. No. 09/498,779, now U.S. Pat. No. 6,741,664 B1, and entitled "Low-Latency High-Speed Trellis Decoder", filed on Feb. 5, 2000, which claims priority to U.S. Provisional Application No. 60/118,725 entitled "Ungerboeck Decoder Architecture" filed on Feb. 5, 1999. These applications are expressly incorporated herein by reference as though fully set forth in full.

BACKGROUND OF THE INVENTION

1. Field of the Invention

The present invention relates generally to methods and systems for decoding input signal samples in a high-speed communication system. More particularly, the invention relates to a method and a system for decoding signals encoded according to the trellis code specified in the Advanced Television Systems Committee (ATSC) Digital Television Standard.

2. Description of Related Art

Error correction systems are typically used to ensure data integrity during storage and transmission. This is accomplished by precoding the data to be protected with one or more so called error correction codes. Trellis codes are a widely utilized sub-class of error correction codes. Though many decoding schemes for trellis codes exist, these are typically optimized for either very high speed operation, or for minimal circuit area. In either case, decoder latency is not a primary concern in these decoding schemes.

The symbol estimates produced by a trellis decoder are much more likely to be correct than the ones produced by a simple slicing procedure, since the trellis decoder utilizes the redundancy structure of the imbedded trellis code when making decisions. However, improved symbol estimates can only be used by the decision feedback equalizer (DFE) portion of the equalizer to increase the performance of the overall system if they are computed with a very short latency. Since the DFE is particularly needed in applications having severe channel impairments, a low-latency decoder is desirable for such applications.

Trellis decoders are maximally efficient error correctors for channels where the noise is uncorrelated from sample to sample. The existence of correlated noise can significantly reduce the effectiveness of this type of error corrector. Traditional trellis decoders are sub-optimal for channels exhibiting a highly correlated noise. One approach to combat this type of channel impairment is to employ multiple encoders/decoders in an interleaving scheme. This approach is practical if the expected correlations span only a relatively small number of symbols. The interleaved multiple-encoder system specified in the ATSC digital television standard is such an encoding system. Therefore, there is a need for an efficient low-latency high-speed decoder that can decode symbols transmitted from such an encoding system in a channel having highly correlated noise.

SUMMARY OF THE INVENTION

The present invention provides a method and a system for decoding a word received at a current time instant into a symbol of a trellis code. The trellis code corresponds to a trellis diagram having N states associated with the current time instant. Each of the N states corresponds to at least one incoming branch. Each of the incoming branches is associated with a symbol of the trellis code. The branch metrics are computed for the incoming branches such that a branch metric represents a distance between the received word and a symbol associated with the corresponding branch. The branch metric is represented by fewer bits than a squared Euclidian metric representation of the distance. For each of the N states, a node metric is computed based on corresponding branch metrics and one of the incoming branches associated with the state is selected. One of the N states is selected as an optimal state based on the node metrics. The symbol associated with the selected incoming branch corresponding to the optimal state is the decoded word.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION OF THE INVENTION

The present invention provides a system and method for efficient, low-latency, high-speed decoding of signal samples encoded according to a trellis code, such as the trellis code specified in the ATSC Digital Television Standard.

The present invention addresses both the latency issue and the issue of decoding symbols transmitted by an interleaved multiple-encoder encoding system, such as the one specified in the ATSC Digital Television Standard, in a channel exhibiting highly correlated noise, while retaining reasonable implementation complexity and cost.

As understood by one having skill in the art, high speed data transmission is often limited by the ability of decoder systems to quickly, accurately and effectively process a transmitted symbol within a given time period. In a ATSC digital television application for example, the symbol decode period is typically taken to be approximately 20 nanoseconds.

For clarity of description, the trellis decoder of the present invention will be described as a decoder for decoding symbols that have been encoded in accordance with the trellis code specified in the ATSC Digital Television standard. This is for illustrative purposes only, and does not constitute a limitation on the application of the present invention.

Figure 1:
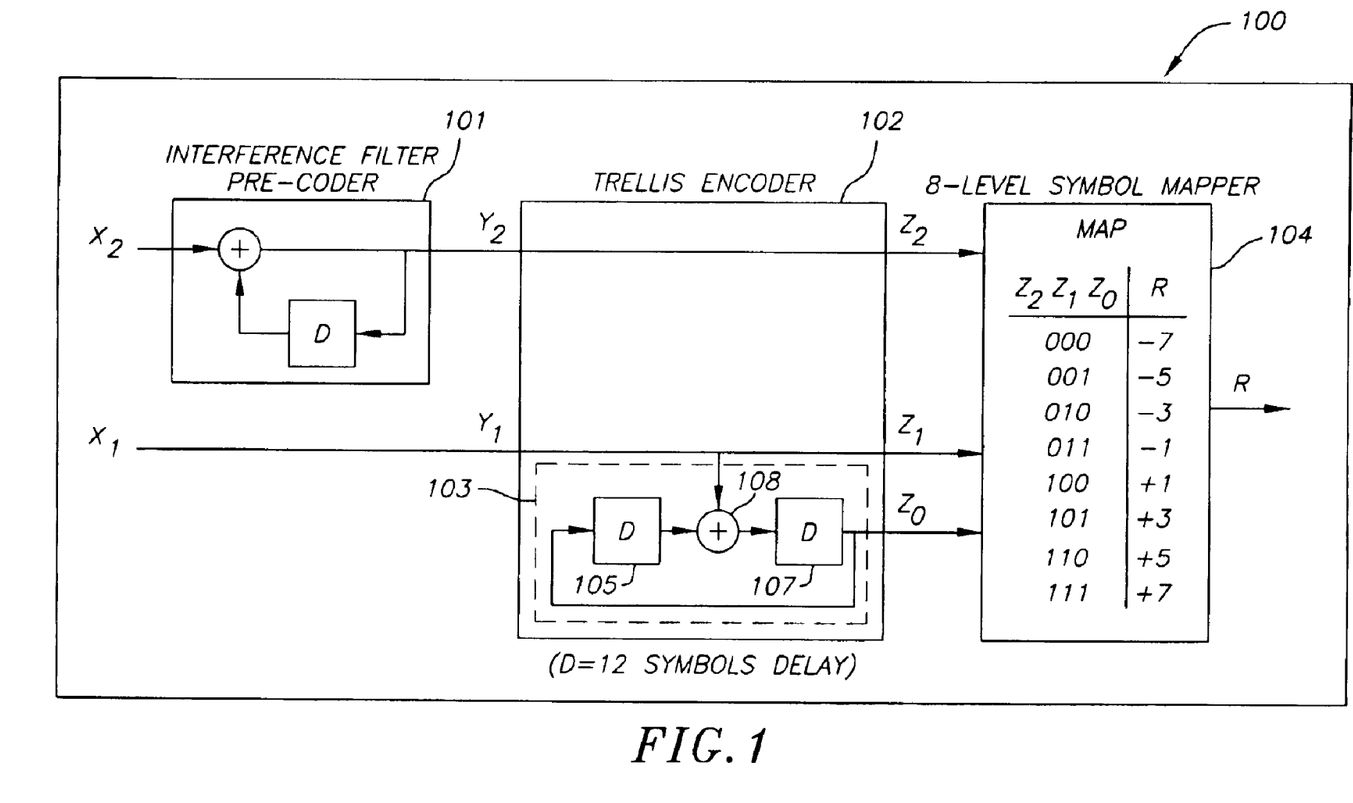
FIG. 1 illustrates an exemplary encoder 100 constructed in accordance with the ATSC Digital Television standard.

FIG. 1 illustrates an exemplary encoder 100 constructed in accordance with the ATSC Digital Television standard. The encoder 100 is represented in simplified form an interference filter pre-coder 101, and a trellis encoder 102 in combination with a signal mapper 104. The trellis encoder 102 includes a 4-state convolutional encoder 103. Data $X_2$ is pre-coded by the interference filter pre-coder 101 to produce data $Y_2$. Data $Y_1$ and $Y_2$ are introduced unchanged to the signal mapper 104 as data $Z_1$ and $Z_2$. The data bit stream $Y_1$ is also inputted into the convolutional encoder 103, implemented as a linear feedback shift register, in order to generate a redundancy bit $Z_0$ which is a necessary condition for the provision of the coding gain of the code. The signal mapper 104 maps the three bits $Z_0 Z_1 Z_2$ to one of the 8 signal values $\{-7, -5, -3, -1, 1, 3, 5, 7\}$, as indicated in FIG. 1.

The convolutional encoder 103 is a linear feedback shift register, constructed of 2 delay elements 105 and 107 (denoted by D) separated by an exclusive-OR circuit 108 which functions to combine the bit sequence $Y_1$ with the output of the delay element 105. The convolutional encoder 103 may be viewed as a state machine having 4 states.

Figure 2:
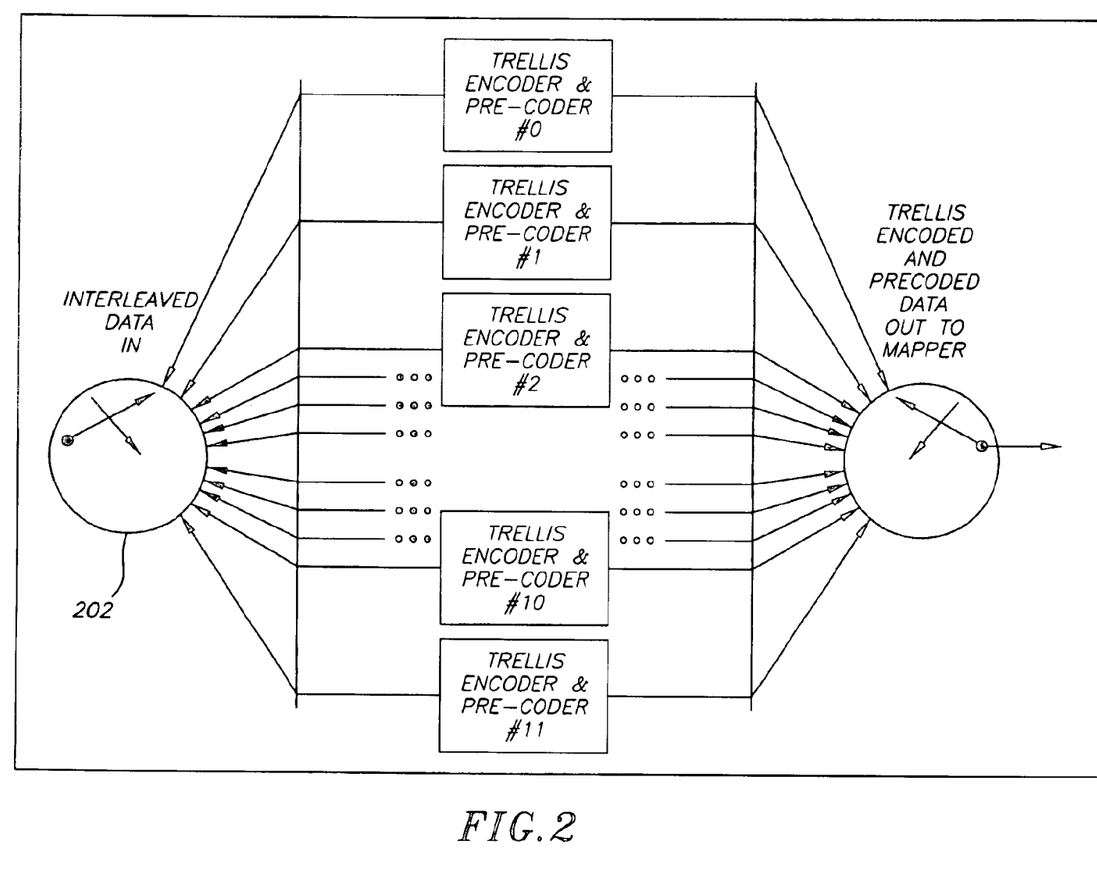
FIG. 2 illustrates a trellis code interleaver as specified in the ATSC digital television standard.

FIG. 2 illustrates the trellis code interleaver as specified in the ATSC digital television standard. Data are fed from the interleaver 202 to the 12 encoders in an interleaved manner. The outputs of the 12 encoders are interleaved and sent out to the mapper. Thus, the transmitted symbols are interleaved symbols produced by 12 different encoders. It will be shown later that the trellis decoder of the present invention can decode the transmitted symbols using a single hardware. Thus, in effect, the trellis decoder of the present invention is equivalent to 12 conventional Viterbi decoders.

Figure 3:
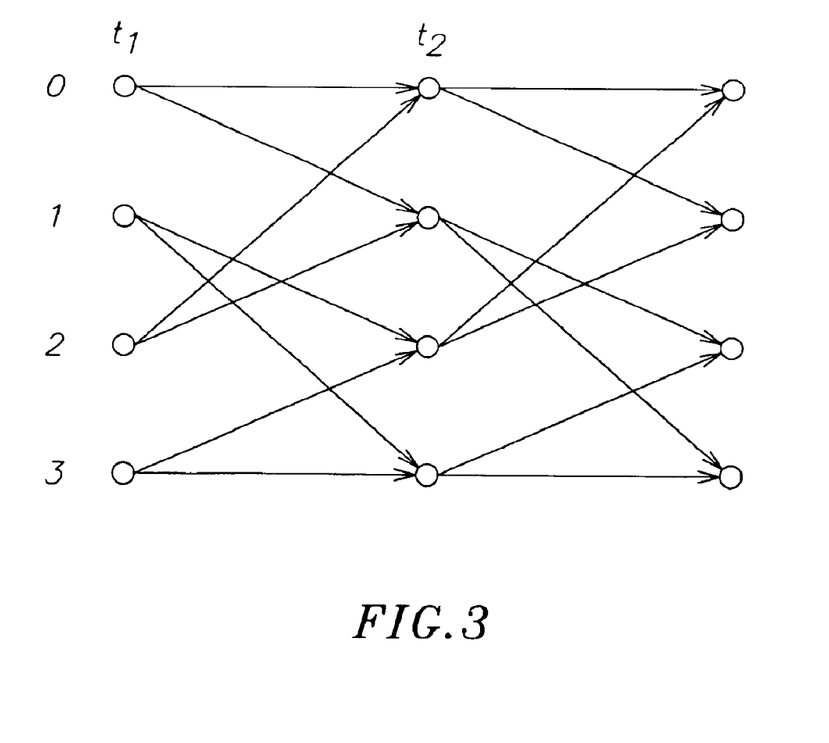
FIG. 3 shows the trellis diagram for the trellis code specified in the ATSC Digital Television Standard and described in FIG. 1.

FIG. 3 shows the trellis diagram for the trellis code specified in the ATSC Digital Television Standard and described in FIG. 1. In the trellis diagram, each vertical column of nodes represents the possible states that the encoder 100 (FIG. 1 can assume at a point in time. It is noted that the states of the encoder 100 are dictated by the states of the convolutional encoder 103 (FIG. 1). Since the convolutional encoder 103 has 2 delay elements, there are 4 distinct states. The 4 distinct states of the encoder 100 are identified by numerals 0 through 3. Successive columns of nodes represent the possible states of the convolutional encoder 103 at successive points in time.

The trellis diagram of FIG. 3 shows that from any even state (states 0 and 2), valid transitions can only be made to successor states 0 and 1. From any odd state (states 1 and 3), valid transitions can only be made to the remaining successor states, i.e., states 2 and 3. Each transition in the trellis diagram, also called a branch, may be characterized by the predecessor state (the state it leaves), the successor state (the state it enters) and the corresponding transmitted symbol. A valid sequence of states is represented by a path through the trellis which follows the above noted rules. A valid sequence of states corresponds to a valid sequence of transmitted symbols. A valid symbol is part of a valid path in the trellis diagram.

At the receiver, the trellis decoder 400 (FIG. 4) of the present invention uses the methodology represented by the trellis diagram of FIG. 3 to decode a sequence of received signal samples into symbols of the trellis code. The trellis decoder 400 functions somewhat in accordance with the well-known Viterbi algorithm but differs from a traditional Viterbi decoder in several aspects.

A traditional Viterbi decoder processes information signals iteratively, on an information frame by information frame basis, tracing through a trellis diagram corresponding to the one used by the encoder, in an attempt to emulate the encoder's behavior. At any particular frame time, the traditional decoder is not instantaneously aware of which node (or state) the encoder has reached, thus, it does not try to decode the node at that particular frame time. Instead, given the received sequence of signal samples, the traditional decoder calculates the most likely path to every node and determines the distance between each of such paths and the received sequence in order to determine a quantity called the node metric (also called path metric).

In the next frame time, the traditional decoder determines the most likely path to each of the new nodes of that frame time. To get to any one of the new nodes, a path must pass through one of the old nodes. Possible paths to each new node are obtained by extending to this new node each of the old paths that are allowed to be thus extended, as specified by the trellis diagram. In the trellis diagram of FIG. 3, there are two possible paths to each new node. For each new node, the extended path with the smallest node or path metric is selected as the most likely path to this new node. The extended path metric, i.e., the node metric of the new node, is equal to the sum of the node metric of the predecessor node and the branch metric of the selected incoming branch to the new node.

By continuing the above path-extending process, the traditional decoder determines a set of surviving paths to the set of nodes at the nth frame time. If all of the paths pass through the same node at the first frame time, then the traditional decoder knows which most likely node the encoder entered at the first frame time, regardless of which node the encoder entered at the nth frame time. In other words, the decoder knows how to decode the received information associated with the first frame time, even though it has not yet made a decision for the received information associated with the nth frame time. At the nth frame time, the traditional decoder examines all surviving paths to see if they pass through the same first branch in the first frame time. If they do, then the valid symbol associated with this first branch is outputted by the traditional decoder as the decoded information frame for the first frame time. Then, the traditional decoder drops the first frame and takes in a new frame for the next iteration. Again, if all surviving paths pass through the same node of the oldest surviving frame, then this information frame is decoded. The traditional decoder continues this frame-by-frame decoding process indefinitely so long as information is received.

The number of symbols that the traditional decoder can store is called the decoding-window width. The traditional decoder must have a decoding window width large enough to ensure that a well-defined decision will almost always be made at a frame time. A decoding failure occurs when not all of the surviving paths to the set of nodes at frame time n pass through a common first branch at frame time 0. In such a case, the traditional decoder would defer making a decision and would continue tracing deeper in the trellis. This would cause unacceptable latency for a high-speed system. Most practical decoders only trace back a fixed distance, before outputting symbol decisions.

Unlike the traditional decoder, the trellis decoder 400 (FIG. 4) of the present invention does not wait until time frame n to decode the signal sample received at time frame 0. Rather, the trellis decoder 400 outputs a decision for a signal sample within a symbol period from the time the signal sample is received. Thus, there is practically no latency. If the outputted decision is incorrect, the trellis decoder 400 will necessarily output a few additional incorrect decisions based on the initial perturbation. It should further be noted that the benefits incurred by using the more accurate Viterbi estimates greatly outweigh the negative ramifications of this potential error source.

It is important to note that, unlike the traditional Viterbi decoder which uses both past and future information to decode, at time frame n, a signal sample received at time frame 0, the trellis decoder of the present invention decodes at time frame 0 a signal sample received at time frame 0, using only past information embedded in node metrics, and not any future information. Thus, the trellis decoder of the present invention uses practically no decoding window width.

The trellis decoder 400 of the present invention can be used to decode any trellis code. It is not limited to the trellis code depicted in FIGS. 1 and 3. The trellis decoder 400 is a particularly suitable architecture for use in a very poor signal-to-noise ratio environment, such as the digital television broadcast reception.

Figure 4:
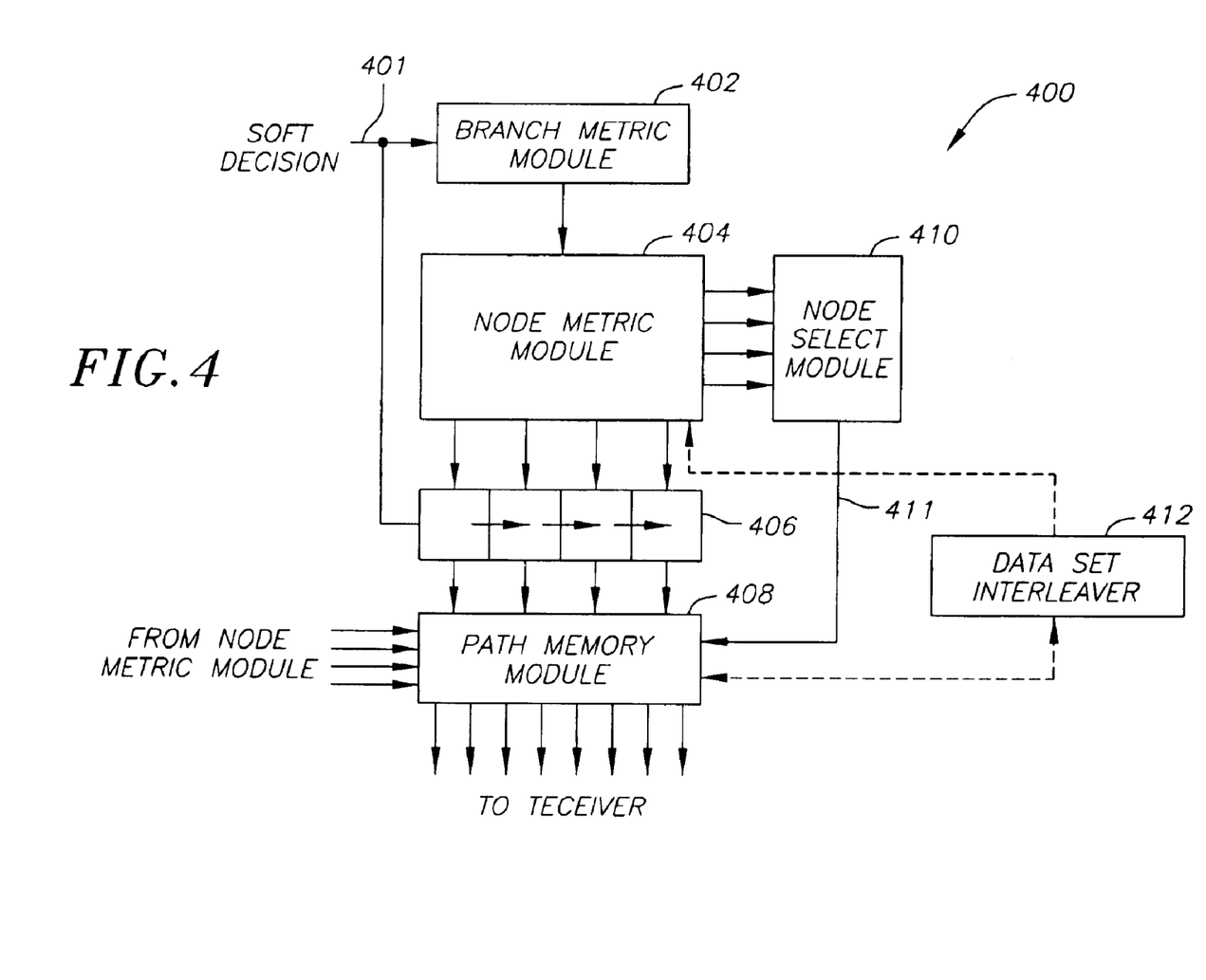
FIG. 4 is a simplified block diagram of an exemplary trellis decoder of the present invention.

FIG. 4 is a simplified block diagram of an exemplary trellis decoder of the present invention. The trellis decoder 400 includes a branch metric module 402, a node metric module 404, an unmapping module 406, a path memory module 408 and a node select module 410. An optional dataset interleaver 412 is used when the symbols to be decoded come from an interleaved multiple-encoder encoding system. The data set interleaver 412 swaps the current working data set in and out of random access memory (RAM) on a symbol by symbol basis, thus allowing the single decoder to process multiple data sets sequentially. The data set includes all state, metric and symbol information associated with the node metric module 404 and the path memory module 408.

Upon reception of a soft decision from the decision feedback equalizer of the receiver, the branch metric module 402 computes branch metrics for the incoming branches to the successor states of the trellis diagram of FIG. 3 and outputs them to the node metric module 404. As will be shown later, although there are 8 branches, only 4 branch metrics need to be computed to fully describe the 8 branches.

The node metric module 404 receives the branch metrics and computes the node metrics for the successor states 0, 1, 2, 3 associated with time $t_2$, based on the branch metrics. The node metric module 404 outputs the node metrics to the node select module 410. The node metric module 404 also outputs, for each state, the node transition, i.e., the selected incoming branch to that state. The node transitions are provided to the unmapping module 406.

The unmapping module 406 uses the soft decision 401 and the node transitions to produce 4 decoded symbols. Each of the decoded symbols is associated with a respective node transition.

The path memory module 408 receives and stores the decoded symbols associated with time frame 0 in an array. The path memory module 408 selects one of the decoded symbols based on the select signal received from the node select module 410 and outputs the selected symbol as the optimal decoded symbol corresponding to the soft decision 401. Every time the path memory module 408 receives a new set of decoded symbols from the unmapper module 406, the path memory module 408 rearranges the symbols previously stored in the memory to form 4 symbol sequences such that each of the 4 symbol sequences corresponds to a path in the trellis diagram, the path going from one of the 4 states at a past time instant to one of the 4 states at the current time instant: This rearrangement is based on the node transitions received from the node metric module 404 and on the possible branch patterns in the trellis diagram. In effect, the path memory module 408 precomputes a complete set of conditional optimal symbol sequences that lead to all possible current states. By "conditional" it is meant that if a current state is optimal then the stored symbol sequence that ends at that state is optimal. Based on the input 411, the path memory module 408 selects the stored symbol sequence that ends at the current optimal state and outputs it as the optimal symbol sequence. Although the path memory module 408 produces symbol sequences that are equivalent to the ones obtained via a traditional Viterbi traceback scheme (as previously described), it employs a conditional feedforward scheme to perform the actual processing. This will be discussed in more detail later, in the description of FIG. 12.

The node select module 410 selects the state having the smallest node metric from the node metrics received from the node metric module 404 as the current optimal state. The output of the node select module 410 is a state label that identifies the current optimal state.

It is well known that optimal metrics for trellis decoders operated in a Gaussian white noise environment correspond to the square of the Euclidian distance between the actual data received and the nearest noise-free symbol value. However, there are several disadvantages to using this form of branch metric. One disadvantage is that the circuitry for a squaring operation is relatively large or slow, depending on implementation. Another disadvantage is that the range of values produced is quite large. This would force the bit width requirements for the node metric computation section of a decoder to be larger than necessary.

Consequently, it is desirable to reduce the dynamic range of the branch metrics produced, while retaining the optimal nature of the metrics. It can be shown mathematically that it is possible to significantly reduce the dynamic range of the branch metrics by adding offsets to and appropriately scaling the metrics that originally correspond to the square Euclidian distances. The expressions of the branch metrics computed by the branch metric module 402 (FIG. 4) of the present invention are derived from the corresponding square Euclidian distances by a method of adding offsets to and appropriately scaling by a global factor these square Euclidian distances.

The reduction in the dynamic range of the branch metrics provides efficiency in data representation. It also reduces latency because the squaring circuits can be replaced by simpler circuits.

A further reduction in dynamic range of the branch metrics can be achieved by thresholding the received signal samples to the limits of the nominal constellation.

As an example, the computation for the branch metrics for the 4-state trellis code of FIG. 3 is described as follows.

Figure 5A:
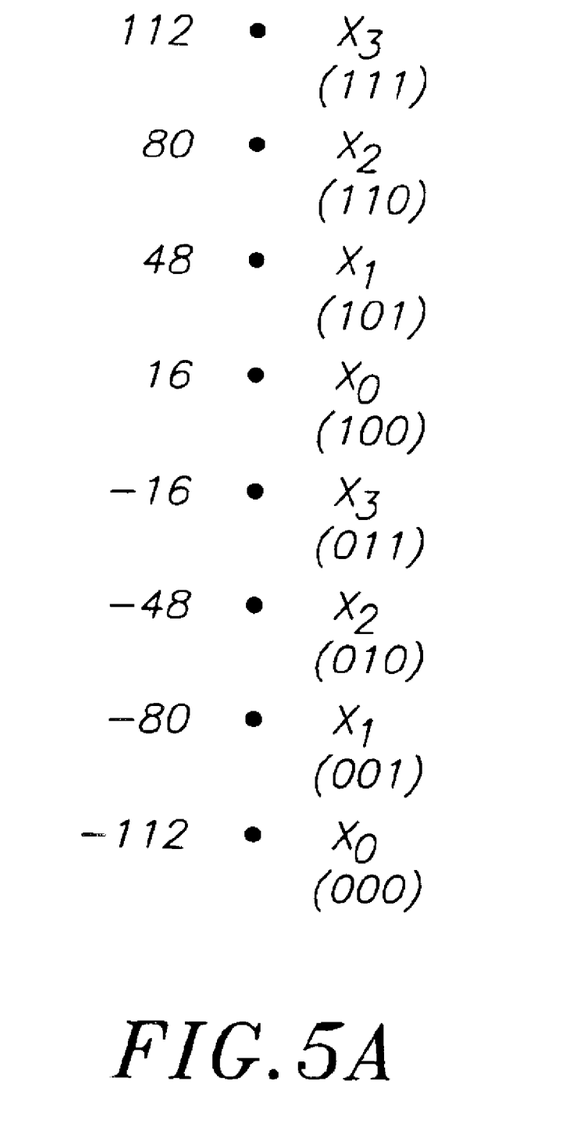
FIG. 5A shows the constellation of the trellis code of FIG. 2 and FIG. 3.

FIG. 5A shows the constellation of the trellis code of FIG. 2 and FIG. 3. The soft decision 401 (FIG. 4) input range is {−128, . . . , +127}. The assigned levels to the constellation points are as shown in FIG. 5A. The constellation points are grouped into even subset {$X_0$, $X_2$} and odd subsets {$X_1$, $X_3$}.

It is important to note that the constellation points form a rectangular grid and that the spacing between adjacent points in one subset (even or odd) is the same as between adjacent points in the other subset. It is also noted that, in FIG. 5A, the bottom 4 constellation points differ from the top 4 constellation points by their most significant bit.

Figure 5B:
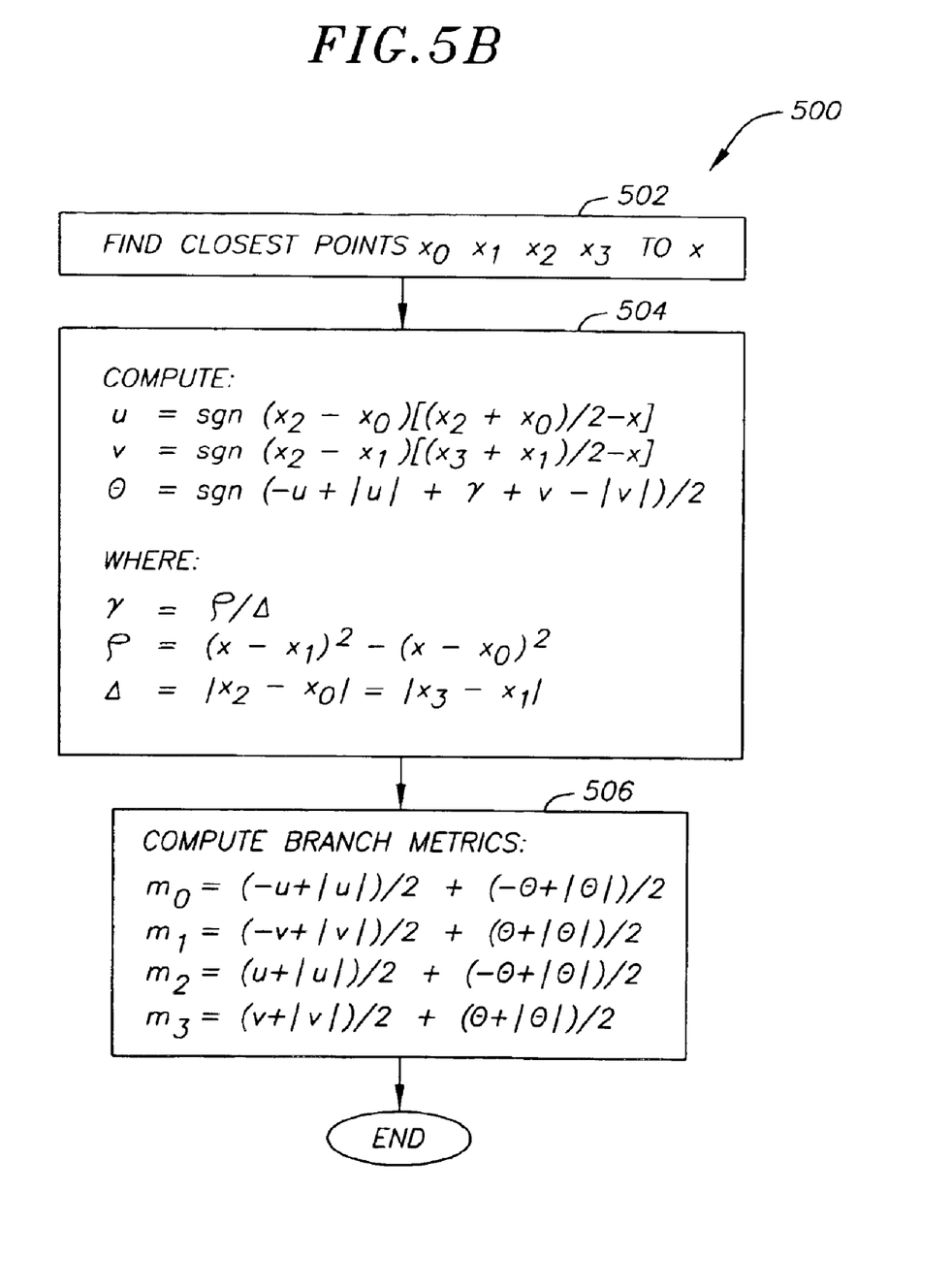
FIG. 5B is a flowchart of the branch metrics computation process of the branch metric module 402.

FIG. 5B is a flowchart of the branch metrics computation process of the branch metric module 402. Upon start, process 500 finds the points in the set {$X_0$ $X_1$ $X_2$ $X_3$} that are closest to a soft decision 401 input value x (block 502). These values are denoted by $x_0$, $x_1$, $x_2$, $x_3$. Then process 500 computes the values u, v and θ (block 504) as follows:

$$u = sgn(x_2 - x_0)[(x_2 + x_0)/2 - x]$$

$$v = sgn(x_3 - x_1)[(x_3 + x_1)/2 - x]$$

$$\theta = (-u + |u| + v - |v|)/2$$

where $$y = \rho/\Delta$$

$$\Delta = |x_2 - x_0| = |x_3 - x_1|$$

$$\rho = (x - x_1)^2 - (x - x_0)^2$$

The process 500 then computes branch metrics $m_0$, $m_1$, $m_2$, $m_3$ (block 506) as follows:

$$m_0 = (-u + |u|)/2 + (-\theta + |\theta|)/2$$

$$m_1 = (-v + |v|)/2 + (\theta + |\theta|)/2$$

$$m_2 = (u + |u|)/2 + (-\theta + |\theta|)/2$$

$$m_3 = (v + |v|)/2 + (\theta + |\theta|)/2$$

Process 500 then terminates.

The results of these computations may be used to generate a table of the $m_0$, $m_1$, $m_2$, $m_3$ values as functions of the soft decision input values. A circuit may then be generated from this table. The circuit would yield the same final results for the branch metrics as process 500.

It is noted that half of the first terms in the expressions of the branch metrics $m_0$, $m_1$, $m_2$, $m_3$, which involve u and v only, will be zero. Similarly, half of the second terms, which involve θ only, will be zero.

It is important to note that the branch metrics as defined by $m_0$, $m_1$, $m_2$, $m_3$ are always positive, and that one of the branch metrics is zero. This facilitates efficient computations in the decoder 400.

Figure 6:
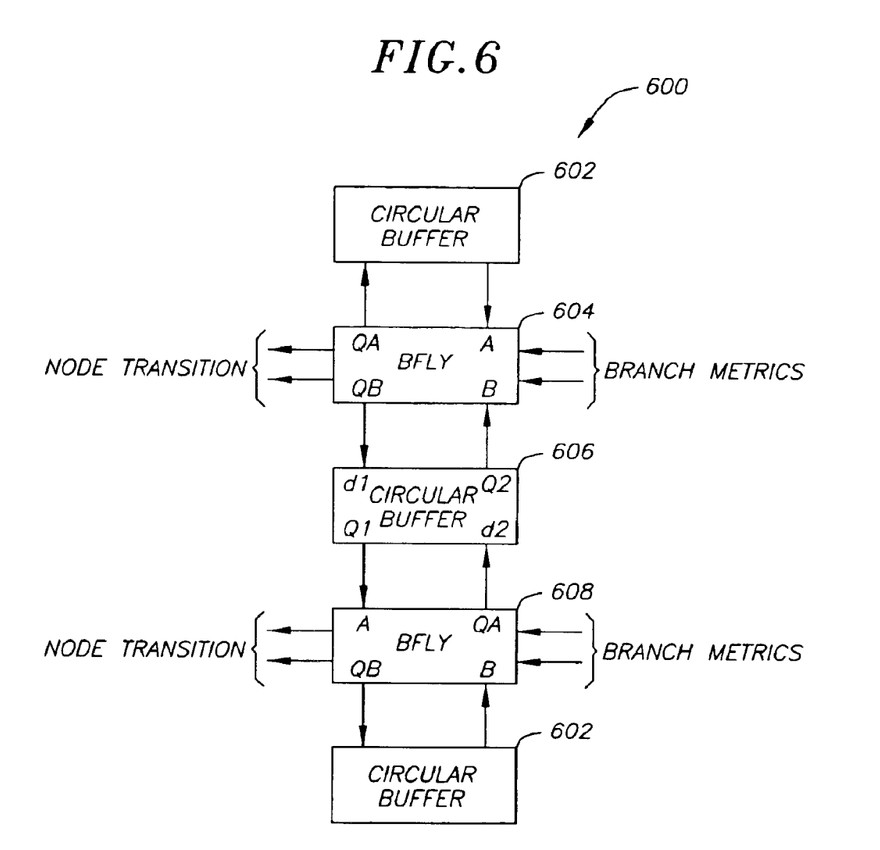
FIG. 6 is a block diagram of an exemplary embodiment of the node metric module.

FIG. 6 is a block diagram of an exemplary embodiment of the node metric module. This embodiment 600 includes two circular buffers 602, 606, and two butterfly circuits 604 and 608. For clarity, the circular buffer 602 is shown twice in FIG. 6, indicating that it is accessed by both butterfly circuits 604 and 608.

Each of the butterfly circuits 604 and 608 computes corresponding two of the 4 node metrics by adding two of the 4 branch metrics to the previous node metrics stored in the corresponding circular buffers. Each of the butterfly circuits 604, 608 is associated with even states or odd states in the trellis diagram, but not both. The circuits 604 and 608 are so called butterflies because they implement what looks like a butterfly in the trellis diagram. Referring to FIG. 3, the transitions from even states 0 and 2 at time $t_1$ to states 0 and 1 at time $t_2$ form one butterfly. The transitions from odd states 1 and 3 at time $t_1$ to states 2 and 3 form the other butterfly. Although there are 4 transitions in a butterfly, only 2 branch metrics are needed for the computation of the node metrics since the two transitions in one-half of the butterfly have the same branch metrics than the other two transitions in the other half. Each of the two butterfly circuits 604 and 608 uses different two of the branch metrics than the other butterfly circuit.

One embodiment of the decoder makes use of the fact that half of the first terms in the expressions of the branch metrics $m_0$, $m_1$, $m_2$, $m_3$, which involve u and v only, will be zero. In this embodiment, the branch metric module does not completely compute the branch metrics. First, it computes the first terms in the expressions of the branch metric, which involve u and v only. Then it computes the second terms in the branch metric expressions, which have θ only. The node metrics are computed in two stages without increasing the latency associated with the selection of the optimal node metric. First, the first terms of the branch metric expressions are added to the previous node metrics. Since half of these first terms are zero, only 2 additions are actually required when adding these first terms to the previous node metrics. Although the resulting values from adding the branch metrics to the previous node metrics are not proper node metrics, the selection of optimal incoming branches, thus, of optimal predecessor states, may be performed on the basis of these incomplete node metric values. The reason is that node metrics for even states are always compared with node metrics for even states, and node metrics for odd states are always compared with node metrics for odd states. The offsets, that is the second terms in the branch metric expressions which have θ only, are always added pairwise to these node metrics for even/odd states. Consequently, selecting the optimal predecessor states based on the non-normalized metrics will still yield the correct results. The actual pairwise renormalization, meaning adding the second terms which involve θ only to the incomplete node metrics, can occur later, utilizing the same hardware used earlier for the adding of the first terms. This reduces the number of adders required in the node metric module by half.

The values retained for the node metrics are not the node metrics themselves, but rather the node metrics modulo a power of 2. The power of 2 is chosen to be greater than two times the maximum spread that will ever occur between any two of the metrics so that the actual ordering of the metrics can be determined by an appropriate modulus comparator. This approach eliminates any need for an explicit renormalization of the node metrics to avoid overflow. In fact, this approach actually allows overflow to occur, and the overflow is the implicit operation of modulo the power of 2. For example, if the maximum spread that can occur between any two node metrics is 144 then 8 bits are needed to represent the spread. The method described above requires adding one extra bit in representing the node metrics so that they are modulo $2^9$. The extra bit is needed to correctly determine which of the 2 compared node metrics is larger. In this example, the comparators for the butterfly circuits in the node metric module are 9-bit comparators.

In one embodiment of the present invention, the adders used in the decoder 400 employ ripple, least significant bit (LSB). to most significant bit (MSB). The comparator circuits are constructed using a fast binary look-ahead scheme This greatly increases the operation speed of the decoder 400.

As described in detail below (FIG. 10), the optimal node label is found by feeding the results of the node metric module 404 (FIG. 4) through a tree of comparators and selectors. This provides a very fast processing speed.

Referring to FIG. 3 and FIG. 6, the butterfly circuit 604 computes the new node metrics for states 0 and 1 based on the previous node metrics of states 0 and 2 provided by the circular buffers 602 and 606, respectively. The butterfly circuit 604 then outputs the optimal trellis transitions (from predecessor states 0 and 2 to states 1 and 0) and the new node metrics for states 0 and 1. The circular buffers 602 and 606 store the new node metrics for states 0 and 1, respectively, for the next computations.

Similarly, the butterfly circuit 608 computes the new node metrics for states 2 and 3 based on the previous node metrics of states 1 and 3 provided by the circular buffers 606 and 602, respectively. The butterfly circuit 608 then outputs the optimal trellis transitions (from predecessor states 1 and 3 to states 2 and 3) and the new node metrics for states 2 and 3. The circular buffers 606 and 602 store the new node metrics for states 2 and 3, respectively, for the next computations.

When the transmitted symbols are from just one encoder, each of the circular buffers 602 and 606 can be implemented as just a simple register.

Figure 7:
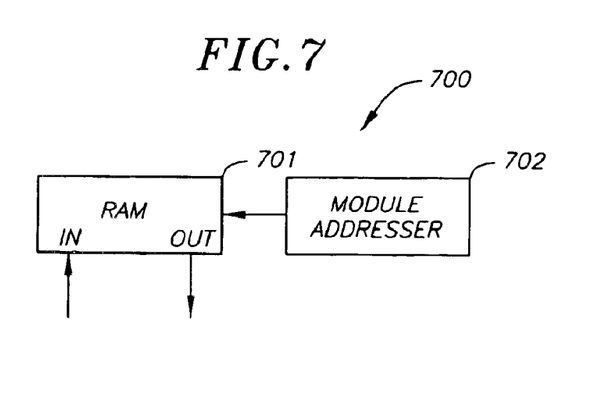
FIG. 7 is a block diagram of an embodiment of the circular buffer for use when the transmitted symbols were formed by interleaving symbols from different encoders.

FIG. 7 is a block diagram of an embodiment of the circular buffer for use when the transmitted symbols were formed by interleaving symbols from different encoders. The circular buffer 700 of FIG. 7 includes a Random Access Memory (RAM) 701 and a module addresser 702.

The module addresser 702 allows different data sets for different decoders to be swapped in and out of the RAM 701 at appropriate times to correctly decode received signal samples that were encoded by different encoders and sent in an interleaving fashion, such as the one described in FIG. 2. To have the correct operational data set to decode a symbol sent by the interleaving encoder system of FIG. 2, the data set interleaver 412 (FIG. 4) uses the module addresser 702 to address different data set locations in the RAM 701 on a symbol period by symbol period basis, thus, in effect, swaps the current working data set in and out of the RAM 701 on a symbol period by symbol period basis.

This architecture allows a single decoder to process multiple data sets sequentially. Thus, when used to decode the symbols transmitted in accordance with FIG. 2 and the ATSC digital television standard, the decoder of the present invention functions as an equivalent of 12 Viterbi decoders.

Figure 8:
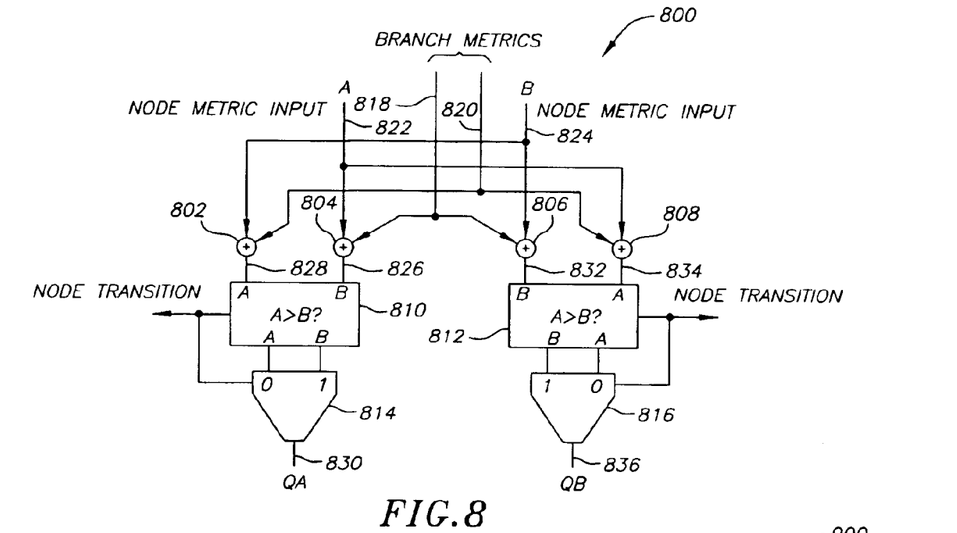
FIG. 8 is a block diagram of an embodiment of the butterfly circuit 604 or 608 of FIG. 6.

FIG. 8 is a block diagram of an embodiment of the butterfly circuit 604 or 608 of FIG. 6. The butterfly circuit 800 includes 4 adders 802, 804, 806, 808, two comparators 810, 812 and two multiplexers 814 and 816.

The branch metrics 818 and 820 are provided by the branch metric module 404 (FIG. 4). The node metrics 822 and 824 are provided by the circular buffers 602 and 606 (FIG. 6).

The branch metric 818 is added to the node metric 822 via adder 804 to produce a possible node metric 826. The branch metric 820 is added to the node metric 824 via adder 802 to produce a possible node metric 828. The comparator 810 outputs values of the possible node metrics to the multiplexer 814. The comparator 810 compares the two possible node metrics 826, 828. If metric 828 is greater than metric 826 then a 1 is outputted as a node transition. This bit value 1 will also cause the multiplexer 814 to select the value of node metric 826, which is the smaller of the possible node metrics 826, 828, to output as the new node metric of the successor state corresponding this half of the butterfly circuit. For example, referring to the trellis diagram of FIG. 3, if this half of the butterfly circuit is used for computing the new node metric of successor state 0 from the predecessor states 0 and 2, then the new node metric 830 is for successor state 0.

The branch metric 818 is added to the node metric 824 via adder 806 to produce a possible node metric 832. The branch metric 820 is added to the node metric 822 via adder 808 to produce a possible node metric 834. The comparator 812 outputs values of the possible node metrics to the multiplexer 816. The comparator 812 compares the two possible node metrics 832, 834. If metric 834 is greater than metric 832 then a 1 is outputted as a node transition. This bit value 1 will also cause the multiplexer 816 to select the value of node metric 832, which is the smaller of the possible node metrics 832, 834, to output as the new node metric of the successor state corresponding to this half of the butterfly circuit. For example, referring to the trellis diagram of FIG. 3, if the other half of the butterfly circuit is used for computing the new node metric for state 0 from predecessor states 0 and 2, then this half of the butterfly circuit is used for computing the new node metric of successor state 1 from the predecessor states 0 and 2. Then, the new node metric 836 is for successor state 1.

Figure 9:
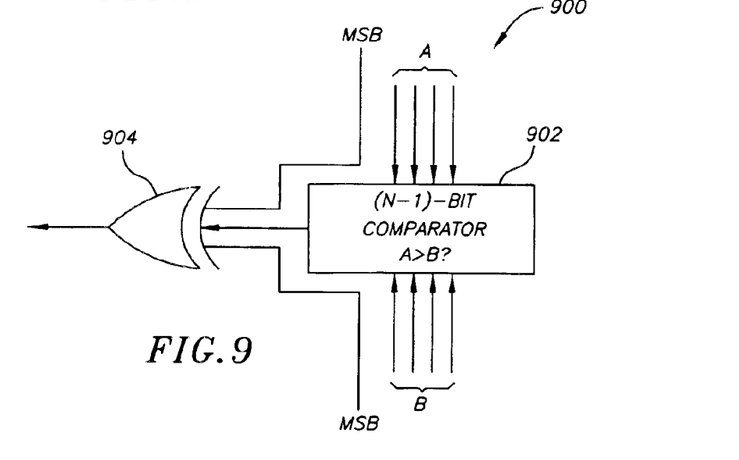
FIG. 9 is a diagram of an embodiment of the comparators used for comparing node metrics, such as the ones in the butterfly circuit of FIG. 8.

FIG. 9 is a diagram of an embodiment of the comparators used for comparing node metrics, such as the ones in the butterfly circuit of FIG. 8. As discussed previously, to correctly compare the node metrics, the modulo-power-of-2 comparator needs to have one additional bit to the number of bits required to represent the maximum spread between any two of the node metrics. Thus, the comparator 900 is an N-bit comparator if the maximum spread can be represented by N−1 bits. The comparator 900 includes a (N−1)-bit comparator 902 and an exclusive-OR gate 904. The comparator 900 compares the last N−1 bits of node metric A with the last N−1 bits of node metric B. If the value represented by the last N−1 bits of A is greater than the one represented by the last N−1 bits of B, then comparator 902 outputs a 1. This 1 is exclusive-ORed with the most significant bits of A and B. The output of the exclusive-OR gate 904 is 1 if A is greater than B, and 0 if A is smaller than B.

Figure 10:
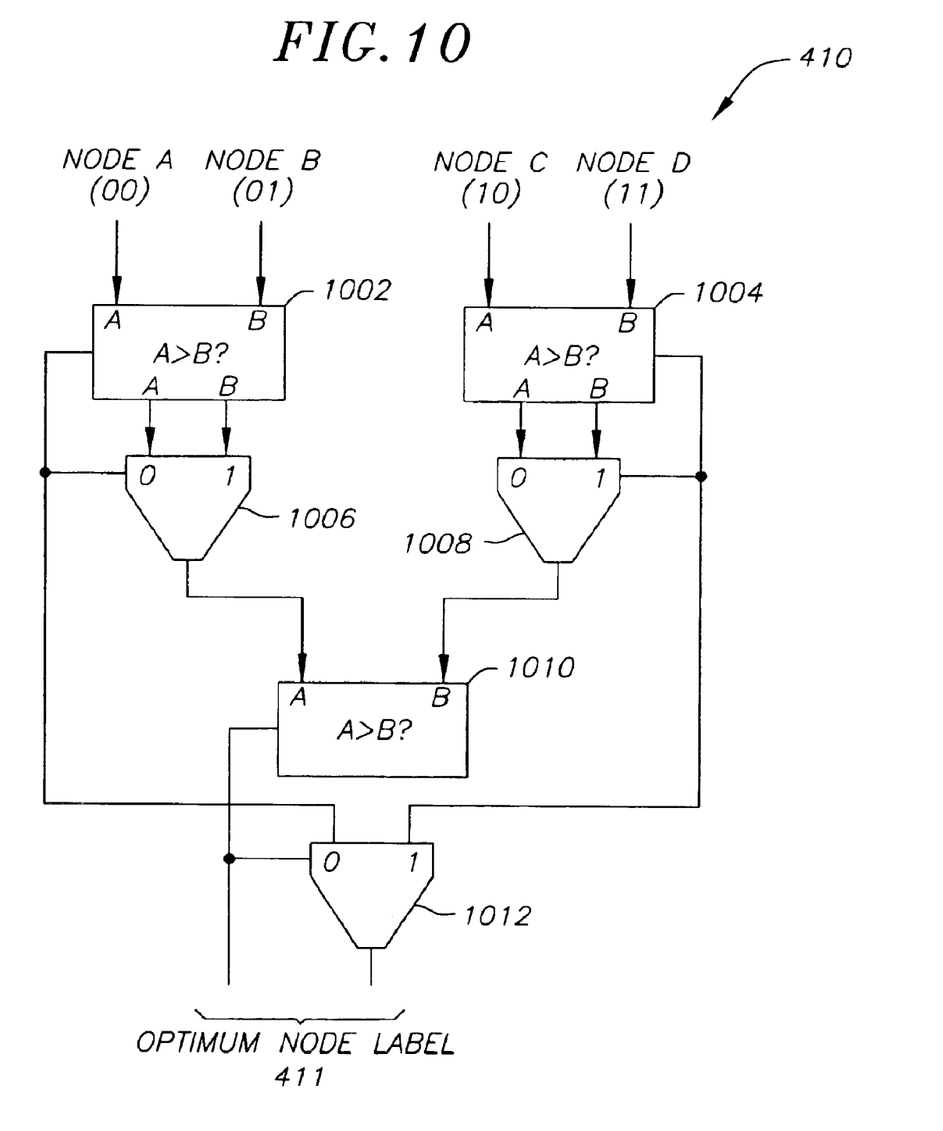
FIG. 10 is a detailed block diagram of an embodiment of the node select module 410 of FIG. 4.

FIG. 10 is a detailed block diagram of an embodiment of the node select module 410 (FIG. 4). In this embodiment, the node select module 410 includes three comparators 1002, 1004, 1010, and three multiplexers 1006, 1008, 1012. This tree architecture of the node select module 410 provides very fast processing speeds.

Comparator 1002 receives node metrics of states 0 and 1 from the node metric module 404 (FIG. 4) and outputs them to multiplexers 1006. Comparator 1002 compares node metric of states 0 with node metric of state 1. If node metric of states 0 is greater than the node metric of states 1 then a 1 is outputted as a select input to multiplexer 1006 and as an input value to multiplexer 1012. If node metric of states 0 is smaller than the node metric of states 1 then a 0 is outputted as a select input to multiplexer 1006 and as an input value to multiplexer 1012.

Comparator 1002 receives node metrics of states 2 and 3 from the node metric module 404 (FIG. 4) and outputs them to multiplexers 1008. Comparator 1004 compares node metric of state 2 with node metric of state 3. If node metric of state 2 is greater than the node metric of state 3 then a 1 is outputted as a select input to multiplexer 1008 and as an input value to multiplexer 1012. If node metric of state 2 is smaller than the node metric of state 3 then a 0 is outputted as a select input to multiplexer 1008 and as an input value to multiplexer 1012.

Based on their respective select inputs, the multiplexers 1006 and 1008 select one of their respective node metric inputs and provide the 2 selected node metrics to the multiplexer 1010. The multiplexer 1010 compares the two node metrics and outputs a 1 if the node metric provided by multiplexer 1006 is greater than the node metric provided by multiplexer 1008, and a 0 otherwise. The output of multiplexer 1010 is also used as a select input for multiplexer 1012. The output of multiplexer 1010 and the output of multiplexer 1012 form the 2-bit label 411 of the current optimal node. This node label 411 is provided to the path memory module 408 (FIG. 4) The unmapping module 406 (FIG. 4) includes one unmapper per trellis state. Thus, for the exemplary decoder of the trellis code described by the trellis diagram of FIG. 3, there are 4 unmappers in the unmapping module 406.

Figures 11A, 11B:
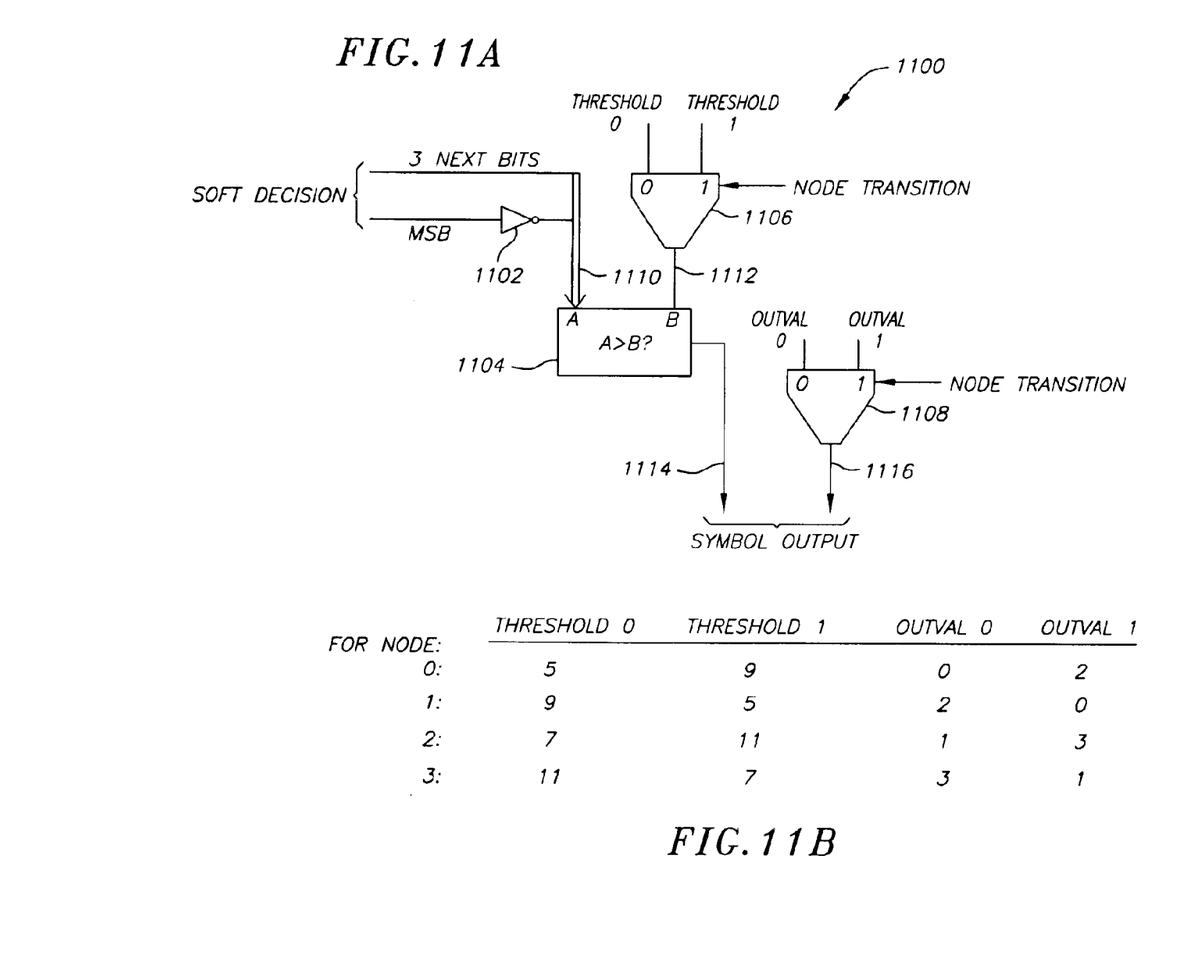
FIG. 11A shows a block diagram of an embodiment of an unmapper suitable for use in the unmapping module 406 of FIG. 4.
FIG. 11B is a table showing the values of threshold0, threshold1, outval0 and outval1 as functions of the trellis states.

FIG. 11A shows a block diagram of an embodiment of an unmapper suitable for use in the unmapping module 406 (FIG. 4). The unmapper 1100 includes an inverter 1102, a comparator 1104 and two multiplexers 1106 and 1108. The inverter 1102 inverts the MSB of the soft decision 401 (FIG. 4). The inverted MSB and the 3 bits next to the MSB of the soft decision 401 are provided as a 4-bit value 1110 to the comparator 1104. The multiplexer 1106 selects one of its inputs, threshold0 and threshold1, based on its select input which is the appropriate node transition for this trellis state, and provides it to the comparator 1104 as input 1112. The node transition is one of the outputs of node metric module 404 (FIG. 4 and FIG. 8). The values of threshold0 and threshold1 are fixed and set according to the table shown in FIG. 11B. The comparator 1104 compares its two inputs 1110 and 1112. If the input 1112 is greater than the input 1110, then the comparator 1104 outputs a 1, otherwise it outputs a 0. The multiplexer 1108 selects one of its two inputs, outval0 and outval1, based on the node transition for this trellis state. The values outval0 and outval1 are fixed and set according to the table shown in FIG. 11B.

The concatenation of the 1-bit output 1114 and 2-bit output 1116 forms the 3-bit optimal symbol for this trellis state. This is the symbol associated with the optimal incoming branch from a predecessor state to this current trellis state.

Figure 12:
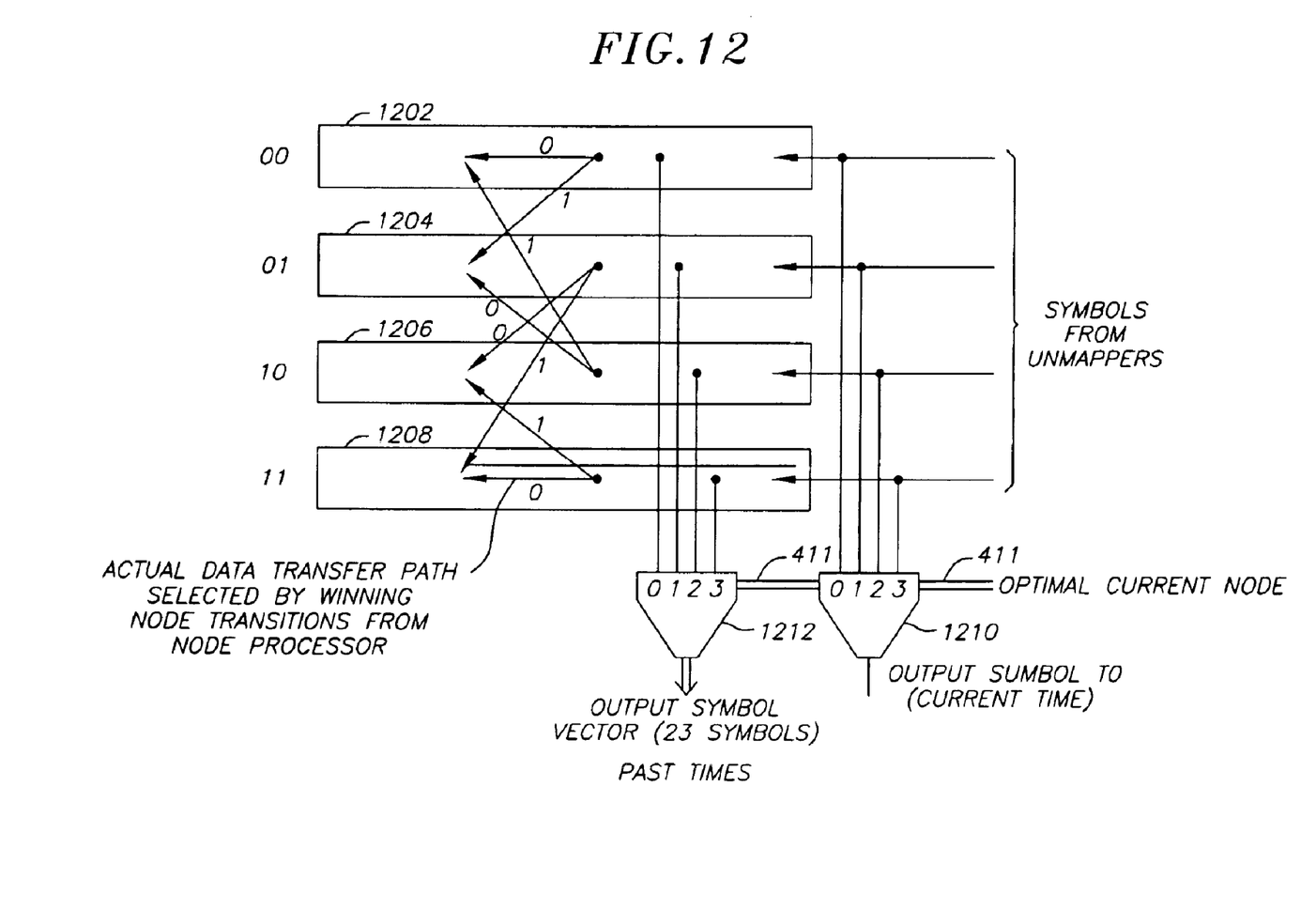
FIG. 12 is a simplified block diagram of an embodiment of the path memory module 408 of FIG. 4.

FIG. 12 shows a simplified block diagram of an embodiment of the path memory module 408 (FIG. 4). In this embodiment, the path memory module 408 includes 4 memory rows 1202, 1204, 1206, 1208, corresponding to states 0, 1, 2, 3, respectively. Symbols stored in each of the 4 memory rows can be thought of as a row vector of optimal symbols for a specific state for successive time frames, with the most current time frame corresponding to the right most end of the row. Current conditional optimal symbols received from the unmapping module 406 are stored at the right most ends of the 4 memory rows. As the current symbols enter the memory rows, the previous stored symbols are rearranged in the following manner. Each of the row vectors is shifted to left by one symbol position and transferred to the memory row that is determined by the corresponding node transition provided by the node metric module 404. For example, if the node transition associated with the current optimal symbol for states 0 is 0, then the row vector of states 0 is shifted to the left by one symbol position but remains in the memory row 0. If the node transition associated with the current optimal symbol for states 0 is 1, then the row vector of states 0 is simultaneously shifted to the left by one symbol position and transferred to the memory row 1204 of state 1. Since there can be only one optimal transition to a state, in the case where the row vector of states 0 is transferred to the memory row 1204 of state 1, the row vector in memory row 1206 of state 2 is simultaneously shifted to the left by one symbol position and transferred to memory row 1202 of state 0. All the possible data transfer paths are shown in FIG. 12. These possible paths correspond to the possible transitions shown in the trellis diagram of FIG. 3.

The multiplexer 1210 selects one of the current conditional optimal symbols from the memory rows 1202, 1204, 1206, 1208 as the current optimal symbol based on the optimal node label 411 provided by the node select module 410 (FIG. 4).

In one embodiment, multiplexer block 1212 includes 23 multiplexers. Each of the 23 multiplexers selects one of the symbols at a past time frame n from the 4 memory rows. Thus, the outputs of multiplexer block 1212 and multiplexer 1210 represent a symbol sequence from time $t_{-23}$ to $t_0$.

In the embodiment when the decoder 400 is used to decode interleaved symbols from different encoders, the operational data set in the path memory module is swapped in and out of a RAM by the data set interleaver 412 on a symbol period by symbol period basis. This swapping ensures that the current operational data set is the correct one for a particular encoder. The swapping is performed at high speed and is transparent to the unaffected parts of the decoder. While certain exemplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and spirit of the invention as defined by the appended claims.

What is claimed is:

1. A method for decoding a signal encoded with a trellis code corresponding to a trellis diagram having a plurality of states, the method comprising:

computing a node metric for each of the plurality of states;

computing a set of conditional optimal symbol sequences leading to all possible current states;

selecting a state having the smallest node metric, as a current optimal state;

selecting an optimal symbol sequence from the computed set of conditional optimal symbol sequences, wherein the selected optimal symbol sequence ends at the selected current optimal state; and outputting the optimal symbol sequence as a decoded signal.

2. The method of claim 1, wherein each of the plurality of states corresponds to at least one incoming branch, and further comprising computing branch metrics for each incoming branches such that each branch metric represents a distance between a received signal and a symbol associated with a corresponding branch.

3. The method of claim 2 wherein each of the branch metrics being represented by fewer bits than a squared Euclidian metric representation of said distance.

4. The method of claim 2 wherein the computing the node metric for each of the plurality of states comprises computing a node metric based on corresponding branch metrics and selecting one of the incoming branches associated with a corresponding state, for each of the plurality of states.

5. The method of claim 4 further comprising storing symbols associated with the selected incoming branches corresponding to the plurality of states, in a memory.

6. The method of claim 2 wherein each of the branch metrics is greater than zero.

7. The method of claim 2 wherein at least one of the branch metrics is equal to zero.

8. A system for decoding a received signal encoded with a trellis code corresponding to a trellis diagram having a plurality of states comprising:
- a node metric module for computing a node metric for each of the plurality of states;
- a path memory module for computing a set of conditional optimal symbol sequences leading to all possible current states; and
- a node select module for selecting a state having the smallest node metric, as a current optimal state, wherein the path memory module selects a conditional optimal symbol sequence from the computed set of conditional optimal symbol sequences that ends at the selected current optimal state, as an optimal symbol sequence and outputs the optimal symbol sequence as a decoded signal.

9. The system of claim 8, wherein each of the plurality of states corresponds to at least one incoming branch, and further comprising a branch metric module for computing branch metrics for each incoming branches such that each branch metric represents a distance between a received signal and a symbol associated with a corresponding branch.

10. The system of claim 9 wherein each of the branch metrics being represented by fewer bits than a squared Euclidian metric representation of said distance.

11. The system of claim 9 wherein the node metric module computes a node metric based on corresponding branch metrics and selects one of the incoming branches associated with a corresponding state, for each of the plurality of states.

12. The system of claim 11 further comprising a memory for storing symbols associated with the selected incoming branches corresponding to the plurality of states.

13. The system of claim 9 wherein each of the branch metrics is greater than zero.

14. The system of claim 9 wherein at least one of the branch metrics is equal to zero.

15. A system for decoding a signal encoded with a trellis code corresponding to a trellis diagram having a plurality of states comprising:
- means for computing a node metric for each of the plurality of states;
- means for computing a set of conditional optimal symbol sequences leading to all possible current states;
- means for selecting a state having the smallest node metric, as a current optimal state;
- means for selecting an optimal symbol sequence from the computed set of conditional optimal symbol sequences, wherein the selected optimal symbol sequence ends at the selected current optimal state; and
- means for outputting the optimal symbol sequence as a decoded signal.

16. The system of claim 15, wherein each of the plurality of states corresponds to at least one incoming branch, and further comprising means for computing branch metrics for each incoming branches such that each branch metric represents a distance between a received signal and a symbol associated with a corresponding branch.

17. The system of claim 16 wherein each of the branch metrics being represented by fewer bits than a squared Euclidian metric representation of said distance.

18. The system of claim 16 wherein the means for computing the node metric for each of the plurality of states comprises means for computing a node metric based on corresponding branch metrics and means for selecting one of the incoming branches associated with a corresponding state, for each of the plurality of states.

19. The system of claim 18 further comprising means for storing symbols associated with the selected incoming branches corresponding to the plurality of states.

20. The system of claim 16 wherein at least one of the branch metrics is greater than zero.

* * * * *